United States Patent [19]
Mitsui et al.

[11] Patent Number: 5,378,923
[45] Date of Patent: Jan. 3, 1995

[54] SEMICONDUCTOR DEVICE INCLUDING A FIELD EFFECT TRANSISTOR

[75] Inventors: Katsuyoshi Mitsui; Masahiro Shimizu, both of Hyogo, Japan

[73] Assignee: Mitsubishi Denki Kabushiki Kaisha, Tokyo, Japan

[21] Appl. No.: 909,324

[22] Filed: Jul. 6, 1992

[30] Foreign Application Priority Data

Jul. 10, 1991 [JP] Japan .................. 3-169721

[51] Int. Cl.$^5$ .................. H01L 29/06; H01L 29/784
[52] U.S. Cl. .................. 257/616; 257/347; 257/607
[58] Field of Search .......... 257/347, 192, 368, 607, 257/352, 353, 616, 382

[56] References Cited

U.S. PATENT DOCUMENTS

| | | | |
|---|---|---|---|
| 4,809,056 | 2/1989 | Shirato et al. | 257/347 |
| 4,982,263 | 1/1991 | Spratt et al. | 257/607 |
| 5,134,447 | 7/1992 | Ng et al. | 257/607 |

OTHER PUBLICATIONS

Tihanyi, Jeno and Schlotterer, Heinrich, "Properties of ESFI MOS Transistors Due to the Floating Substrate and the Finite Volume", IEEE Transactions on Electron Devices, vol. ED-22, No. 11, pp. 1017–1023, Nov. 1975.

*Primary Examiner*—Robert P. Limanek
*Assistant Examiner*—David B. Hardy
*Attorney, Agent, or Firm*—Lowe, Price, LeBlanc & Becker

[57] ABSTRACT

Holes generated by impact ionization in a SOI-MOS transistor is removed from the channel region to improve the breakdown voltage between the source and drain. A channel region of the SOI-MOS transistor is formed of a p type silicon layer. A drain region is formed of an n type silicon layer. A source region adjacent to the channel region includes an n type germanium layer. The forbidden energy band gap width of the germanium is smaller than that of the silicon. The n type germanium layer is formed in at least a portion of the source region. This layer is formed by ion-implanting germanium into a portion of the silicon layer, or removing a portion of the silicon layer, followed by growing a germanium layer in an epitaxial manner thereabove.

3 Claims, 13 Drawing Sheets $E_{g2} < E_{g1}$

FIG. 3(A)
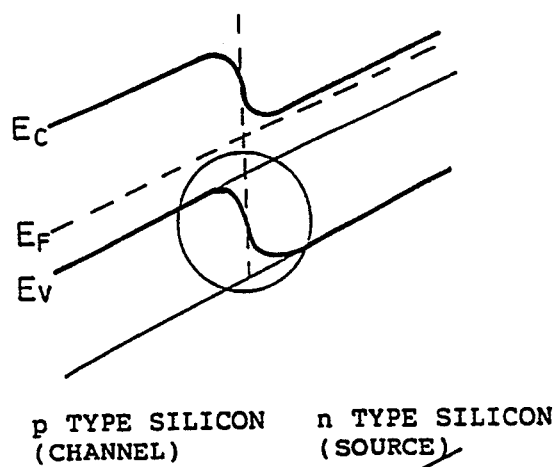
p TYPE SILICON (CHANNEL)    n TYPE SILICON (SOURCE)
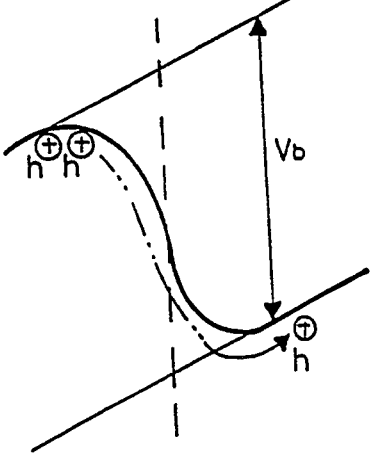
FIG. 3(B)
FIG. 4(A)
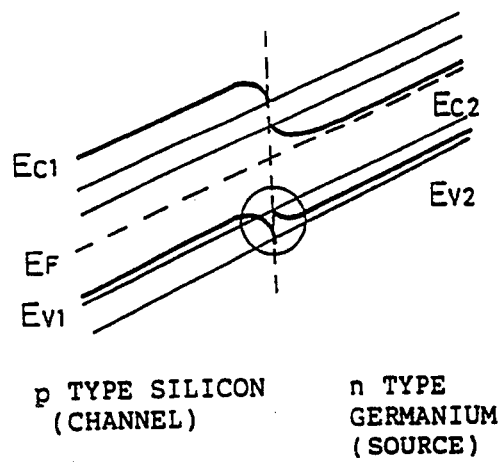
p TYPE SILICON (CHANNEL)    n TYPE GERMANIUM (SOURCE)
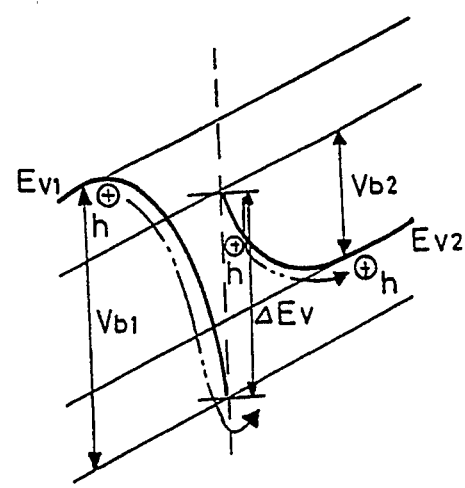
FIG. 4(B)

T = 0 (K)

T ≠ 0 (K)

p TYPE SEMICONDUCTOR n TYPE SEMICONDUCTOR

SEMICONDUCTOR DEVICE INCLUDING A FIELD EFFECT TRANSISTOR

BACKGROUND OF THE INVENTION

1. Field of the Invention

The present invention relates to a semiconductor device including a field effect transistor and the method of manufacturing thereof, and more particularly, to a semiconductor device including a field effect transistor having a source, a drain, and a channel region in a semiconductor layer formed on an insulation substrate {SOI-MOS (Silicon on Insulator-Metal Oxide Semiconductor)} and a method of manufacturing thereof.

2. Description of the Background Art

A field effect transistor having a source/drain region formed on the surface of a semiconductor substrate such as of silicon is called a bulk MOS. There is another field effect transistor called a SOI-MOS in which the source, drain, and channel regions are formed in a silicon thin film on an insulative thin film or on an insulative substrate such as of sapphire.

FIG. 19 shows a plan view (A) and a sectional view (B) of a conventional SOI-MOS transistor. The sectional view of (B) is taken along line B—B of (A). Referring to FIG. 19, an insulation film 2 is formed on a substrate 1. An island-like silicon semiconductor film 3 is formed on insulation film 2. A channel region 4 including p type impurities of low concentration is formed in semiconductor film 3. A source region 12 and a drain region 8 including n type impurities of high concentration are formed adjacent to one side and the other side of channel region 4. A gate insulation film 5 is formed on channel region 4. A gate electrode 6 is formed on gate insulation film 5. Semiconductor film 3 and gate electrode 6 are coated with an interlayer insulation film 9. Interlayer insulation film 9 has a contact hole 10 formed therein. A conductive layer 11 is provided to contact source region 12 and drain region 8 via each contact hole 10.

The operation of a conventional SOI-MOS transistor of the above-described structure will be explained hereinafter.

On applying positive voltage to gate electrode 6, electrons are attracted as n type carriers in the proximity of gate electrode insulation film 5 at the upper portion of channel region 4. The region having electrons attracted is inverted to the n type which is identical to those of source region 12 and drain region 8. As a result, current can flow between source region 12 and drain region 8. The electrons drawn by the gate voltage moves from source region 12 to drain region 8 due to the difference of voltage applied to source region 12 and drain region 8. That is to say, current flows from drain region 8 to source region 12. The density of the attracted electrons vary with the voltage applied to gate electrode 6. Therefore, the current flowing across channel region 4 can be controlled by the gate voltage.

The following problems are encountered in the operation of such a SOI-MOS transistor. FIG. 20 schematically shows a sectional view of a conventional SOI-MOS transistor for describing the mechanism of destruction of the transistor. Referring to FIG. 20, potential difference is applied between the source and drain, and positive voltage is applied to the gate to bring the SOI-MOS transistor into operation. If the drain voltage is increased at this time, the electric field in the direction of the channel increases significantly in the proximity of the drain. The electrons injected into the channel region from the source region (a of FIG. 20) are accelerated by this high electric field to easily become more energetic. These highly energetic electrons collide with the lattice of the silicon in the proximity of the end of the drain region, as shown in FIG. 20, to generate in an avalanche manner a quantity of electron-hole pairs. Electrons and holes are generated by this collision ionization (impact ionization; b of FIG. 20), whereby these electrons are drawn towards the high drain electric field into the drain region to become a portion of the drain current. The generated holes are pushed back by the drain electric field to flow and accumulate in the depletion layer beneath the channel region or in the lower portion of the channel region in the proximity of the source region (c of FIG. 20). Such a phenomenon is seen not only in a MOS transistor of a short channel length, but also in that having a relatively long channel length. Particularly in a MOS transistor of a short channel length, a great amount of electron-hole pairs are generated in comparison with that of a MOS transistor having a long channel length.

Thus, the potential of the channel region rises when the holes generated by impact ionization flow into and accumulate in the lower portion of the channel region. The threshold voltage of the MOS transistor is decreased. This induces a kink effect as shown in FIG. 21 of the drain current versus voltage characteristic. A kink effect is a phenomenon where the drain current does not saturate substantially to a constant value, but shows a sudden increase as the drain voltage is increased. In the case of an n channel type MOS transistor, for example, the increase of the drain voltage will cause the holes of the electron-hole pairs generated by impact ionization and the like of the channel carriers to accumulate in the channel region, whereby the channel region is biased positively to decrease the threshold voltage. As a result, the drain current suddenly increases. In plotting this drain current with respect to the drain voltage, a kink is seen in the high current region, to be termed a kink effect. This kink effect is described in detail in, for example, JENO TIHANYI and HEINRICH SCHLOTTERER "Properties of ESFI MOS Transistors Due to the Floating Substrate and the Finite Volume" IEEE TRANSACTIONS on ELECTRON DEVICES, VOL. ED-22, No. 11, pp. 1017–1023 NOVEMBER 1975. In particular, this kink effect is different in degrees between devices.

When holes generated by impact ionization are accumulated in the lower portion of the channel region, the potential of the channel region and in the proximity of the source region is further increased by the accumulated holes. This decreases the potential difference between the channel region and the source region. The decrease of the potential barrier in the proximity of the source region will cause many electrons to be injected from the source region to the channel region. This causes furthermore electron-hole pairs to be generated since the impact ionization becomes more significant. The generated holes will further decrease the potential barrier in the proximity of the source region to further increase electrons injected from the source region, so that finally breakdown occurs in the MOS transistor.

Because the MOS transistor is formed on an insulative substrate or film according to the SOI-MOS structure, the substrate region (channel region) of the MOS transistor is electrically at a floating state. When the drain voltage is increased, the holes of the electron-hole pairs generated by impact ionization of the channel carriers in the case of, for example, an n channel type MOS transistor, accumulates in the substrate region to bias positively the substrate region. Therefore, the threshold voltage is decreased to result in a sudden increase in the drain current. Thus, the potential of the substrate region of such a SOI-MOS transistor is unstabilized. This phenomenon is called the substrate floating effect.

The above phenomenon can be described using a band diagram of the energy band of a semiconductor where holes generated by impact ionization is accumulated in the lower portion of the channel region. The band diagram will be schematically described with reference to FIG. 22. The electrons in solids cannot take all energy levels. There is an allowed band of an energy range where electrons in solids can exist. There is also a forbidden band of energy range where electrons in solids cannot exist. The structure of the allowed band and the forbidden band differ according to the types and configuration of atoms forming the object substance. For example, monocrystals of silicon and germanium have a tetrahedral atomic configuration. Such a monocrystal of a semiconductor has an empty tolerance band (conduction band) where no electrons exist at absolute zero via a forbidden band above an allowed band (valence band) completely filled by electrons. This structure is shown in FIG. 22(A). The conduction band exists above the valence band by a forbidden energy band gap width (band gap) $E_g$ of an energy level. In absolute zero (T=0K), the electrons of the above-described semiconductor usually do not contribute to electrical conduction and behave as insulators.

However, since forbidden energy band gap width $E_g$ is a finite value (several eV), electrons of the completely filled valence band are excited to the conduction band above the forbidden band by thermal function if not at absolute zero. This situation is shown in FIG. 22(B). The excited electrons can move relatively freely in the conduction band above the forbidden band. Therefore, these excited electrons can contribute to electrical conduction. In the valence band beneath the forbidden band, the shortage of electrons will cause the travel of holes.

The electrical conduction of a semiconductor is caused by the travel of excited electrons to the conduction band which is the allowed band above the forbidden band, and the travel of holes in the valence band which is the allowed band beneath the forbidden band. The value of forbidden energy band gap width $E_g$ depends upon the substance, which is for example, 1.1 eV for silicon (Si), 0.66 eV for germanium (Ge), 1.27 eV for indium phosphorus (InP), 2.25 eV for gallium phosphorus (GAP), and 1.43 eV for gallium arsenide (GaAs).

By adding impurities into a semiconductor for forming an energy level in the forbidden band, the electron density of the conduction band above the forbidden band and the hole density of the valence band beneath the forbidden band can be controlled.

For example, by adding boron into the silicon, the boron forms an energy level higher by 0.045 eV on the valence band entirely filled with silicon electrons. Because boron is trivalent with one valence electron fewer than that of the tetravalent silicon, the electrons are easily excited from the valence band beneath the forbidden band to the energy level of boron by 0.045 eV due to thermal effect. This generates the state of many electron shortage i.e. holes in the valence band of the forbidden band. This is shown in FIG. 22(C). The density of the holes can be controlled by the amount of impurities added.

Another example is considered where arsenic is added into the germanium. Arsenic will form below the conduction band of the germanium an energy level lower by 0.013 eV. Because arsenic is pentavalent with one more valence electron than that of the tetravalent germanium, electrons are easily excited from the energy level of the arsenic to the conduction band above the forbidden band by 0.013 eV by thermal effect. Thus, many electrons are generated in the conduction band above the forbidden band. This situation is shown in FIG. 22(D). The density of electrons can be controlled by the amount of impurities added.

The impurities added to the semiconductor serve only to receive electrons from the valence band beneath the forbidden band of the semiconductor or to provide electrons to the conduction band above the forbidden band.

The silicon having boron added, for example, as described above, is called a p type semiconductor. The germanium having arsenic added is called an n type semiconductor. The energy band of a p type semiconductor is shown in FIG. 22(E), and the energy band of an n type semiconductor is shown in FIG. 22(F). An energy level having an existence probability of ½ of electrons within a semiconductor is defined Fermi level $E_F$. The Fermi level is located substantially in the middle of the forbidden band in a semiconductor that does not include impurities. In the case where p type impurities such as boron are added, the Fermi level $E_F$ moves to the side of the valence band beneath the forbidden band since there is an overall shortage of electrons, as shown in (E) of FIG. 22. In the case where n type impurities such as arsenic are added, the Fermi level $E_F$ moves to the side of the conduction band above the forbidden band due to the entire increase of electrons, as shown in (F) of FIG. 22.

The formation of a pn junction with a p type semiconductor and an n type semiconductor having the above described energy bands results in the energy band of FIG. 23. FIG. 23 shows a band diagram of a pn junction where an n+ region and a p− region are respectively formed in the silicon. The Fermi level $E_F$ must be identical in the entire pn junction due to the thermal equilibrium state. It can be seen from FIG. 23 that the energy level $E_C$ of the lowest end of the conduction band and the energy level $E_V$ of the highest end of the valence band respectively show a curve configuration in the boundary regions $x_n$ and $x_p$ of the pn junction.

Consider the pn junction of FIG. 23 having the n+ region correspond to source region 12, and the p− region correspond to channel region 4 of FIG. 19. Holes existing in the lower portion of the channel region cannot flow into the source region since there is a potential barrier $V_b$ between the channel region and the source region. It is therefore considered that holes generated by impact ionization are accumulated in the lower portion of the channel region.

Since a conventional SOI-MOS transistor is configured as described above, holes generated by impact ionization are accumulated in the lower portion of the channel region. This induces the problem that the potential in the channel region is increased to decrease the breakdown voltage between the source and drain of a MOS transistor.

The decrease of breakdown voltage between the source and drain is caused by the substrate floating effect particular to a SOI-MOS structure. Since the potential barrier $V_b$ between the source region and the channel region is great, as shown in the band diagram of FIG. 23, there is an inherent problem that the holes accumulated in the lower portion of the channel region could not be removed.

SUMMARY OF THE INVENTION

An object of the present invention is to prevent the breakdown voltage between the source and drain of a SOI-MOS transistor from decreasing.

Another object of the present invention is to eliminate the need of fixation of potential of a semiconductor substrate in a bulk MOS transistor.

A further object of the present invention is to remove essentially holes (or electrons) generated by impact ionization from the channel region in a field effect transistor.

Yet another object of the present invention is to stabilize the potential in the channel region of a field effect transistor.

A still further object of the present invention is to manufacture a SOI-MOS transistor that allows prevention of decrease in breakdown voltage between the source and drain.

Yet a further object of the present invention is to manufacture a field effect transistor that allows the removal essentially of holes (or electrons) generated by impact ionization from the channel region.

Yet a still further object of the present invention is to manufacture a field effect transistor that allows stabilization of potential in the channel region.

A semiconductor device including a field effect transistor according to an aspect of the present invention includes a semiconductor layer of a first conductivity type, first and second impurity regions of a second conductivity type, and a gate electrode. The semiconductor layer has a main surface and includes a first semiconductor having a first forbidden energy band gap width. The first and second impurity regions are formed in the semiconductor layer with a distance therebetween to define a channel region with a portion of the main surface of the semiconductor layer as the channel face. The gate electrode is formed above the channel face with an insulation film therebetween. At least the second impurity region includes a second semiconductor having a second forbidden energy band gap width that is smaller than the first forbidden energy band gap width.

A method of manufacturing a semiconductor device including a field effect transistor according to another aspect of the present invention includes the step of forming a semiconductor layer of a first conductivity type including a first conductor having a first forbidden energy band gap width. A gate insulation film is formed on the main surface of the semiconductor layer. A gate electrode is formed on the gate insulation film between a pair of regions so as to form the pair of regions with a distance therebetween in the semiconductor layer. At least a portion of the semiconductor layer corresponding to one of the pair of regions is substituted by a second semiconductor having a second forbidden energy band gap width that is smaller than the first forbidden energy band gap width. By selectively doping impurities of a second conductivity type into the semiconductor layer using the gate electrode as a mask, a first impurity region and a second impurity region are formed in one and the other of the regions, respectively.

In the present invention, the channel region of the first conductivity type includes a first conductor having the first forbidden energy band gap width. The first impurity region of the second conductivity type adjacent to the channel region includes a second conductor having a second forbidden width that is smaller than the first forbidden energy band gap width. Therefore, the potential barrier of the valence band in the boundary region between the first impurity region and the channel region can be reduced in comparison with the case where the first impurity region and the channel region are formed of the same semiconductor. The holes (or electrons) generated by impact ionization and accumulated in the lower portion of the channel region can easily diffused into the first impurity region. Therefore, holes (or electrons) generated by impact ionization can be removed from the channel region. As a result, the potential of the channel region can be stabilized, and prevent the breakdown voltage between the source and drain from decreasing in a SOI-MOS transistor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3(a)-(b) are a band diagram where reverse bias is applied to the pn junction of a conventional SOI-MOS transistor.

FIGS. 4(a)-(b) are a band diagram where reverse bias is applied to the pn junction of the SOI-MOS transistor of the present invention.

FIG. 7 is a sectional view of a bulk MOS transistor showing an embodiment in which the present invention is applied to.

DESCRIPTION OF THE PREFERRED EMBODIMENTS (B) of FIG. 1 is a sectional view taken along line B—B of (A). Referring to FIG. 1, an insulation film 2 of silicon oxide and the like is formed on a substrate 1. An island-like semiconductor film 3 is formed on insulation film 2. A channel region 4 formed of a silicon layer including p type impurities of low concentration is formed in semiconductor film 3. A source region 7 and a drain region 8 including n type impurities of high concentration are formed adjacent to one side and the other side of channel region 4. Source region 7 is formed of a germanium layer having a forbidden energy band gap width that is smaller than that of silicon. Drain region 8 is formed of a silicon layer. A gate insulation film 5 is formed on channel region 4. A gate electrode 6 is formed on gate insulation film 5. Semiconductor film 3 and gate electrode 6 are coated with an interlayer insulation film 9. A contact hole 10 is formed in interlayer insulation film 9. A conductive layer 11 is provided to make electrical contact with source region 7 and drain region 8 through each contact hole 10.

The operation of the SOI-MOS transistor of the above structure will be described hereinafter. Potential difference is applied between source region 7 and drain region 8, and positive voltage is applied to gate electrode 6 to bring the SOI-MOS transistor into an operative state. Electrons are accelerated within channel region 4 due to an electric field generated by the potential difference between source region 7 and drain region 8. These electrons generate electron-hole pairs due to impact ionization in the proximity of drain region 8. The generated electrons flow into drain region 8. The generated holes accumulate in the lower portion of channel region 4 in the proximity of source region 7.

Source region 7 is formed of an n type semiconductor having a forbidden energy band gap width that is smaller than that of channel region 4. Therefore, the holes accumulated in the lower portion of channel region 4 easily flow into source region 7 in comparison with a conventional SOI-MOS transistor. The amount of holes accumulated in the lower portion of channel region 4 is therefore decreased. As a result, the rise in potential of the channel region due to impact ionization can be suppressed. Therefore, decrease in the breakdown voltage between the source and drain of the MOS transistor can be prevented.

Figure 1A:
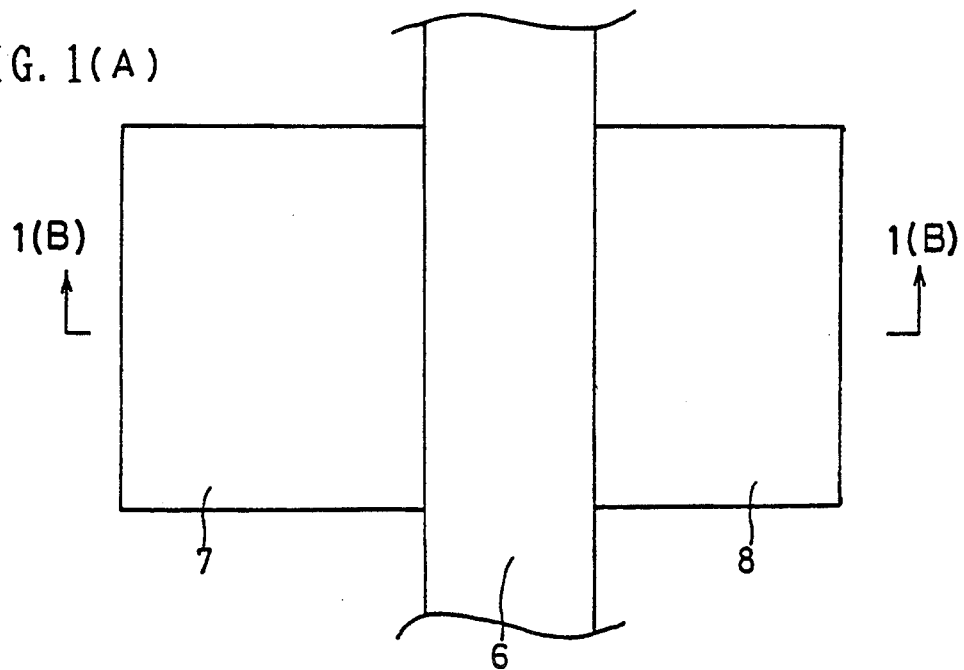
FIG. 1 is a plan view (A) and a sectional view (B) of a SOI-MOS transistor according to an embodiment of the present invention.
Figure 1B:
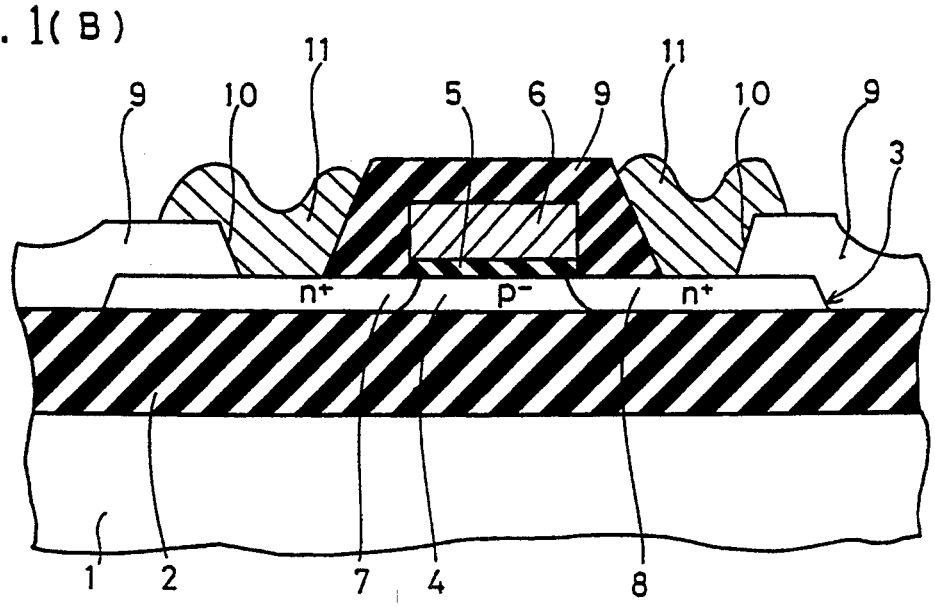
Figure 2:
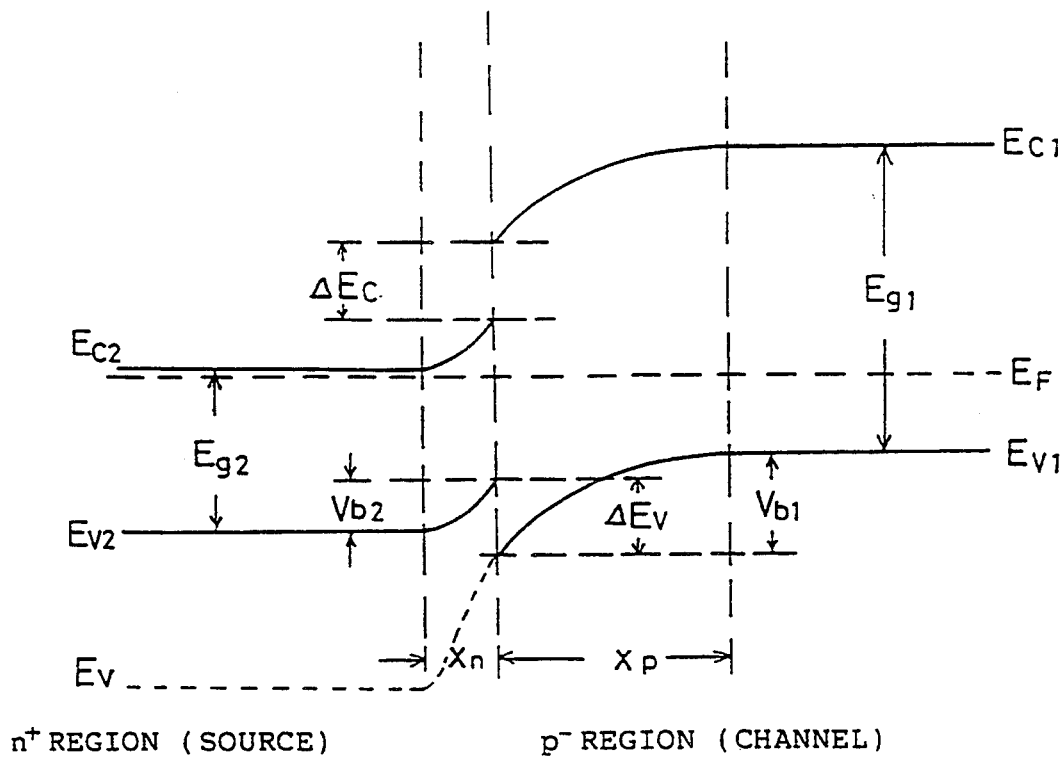
FIG. 2 is a band diagram showing the pn junction between the source region and the channel region of the SOI-MOS transistor of the present invention.
Figure 23:
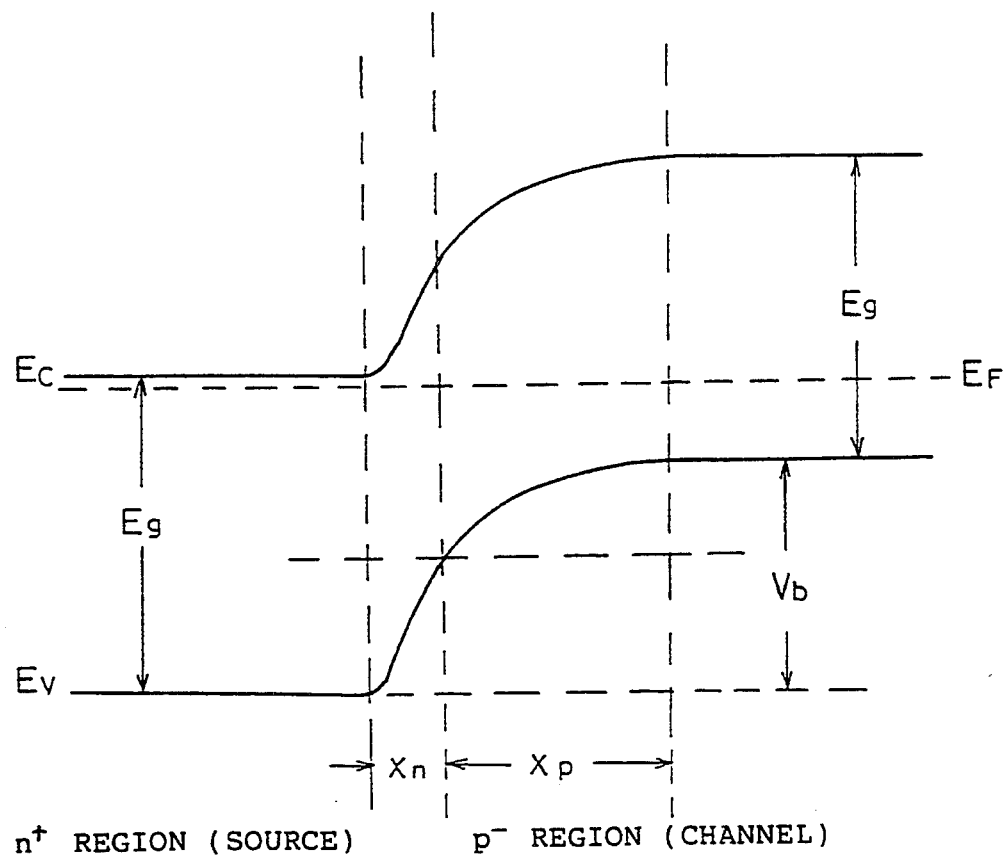
FIG. 23 is a band diagram showing the pn junction of the channel-source region in a conventional SOI-MOS transistor.

The reason will be explained hereinafter why holes accumulated in the lower portion of the channel region easily flows into the source region in the SOI-MOS transistor of the present invention. FIG. 2 is a band diagram showing the energy band of the pn junction formed by p type silicon and n type germanium. Taking into consideration the MOS transistor of FIG. 1, source region 7 is the n+ region of n type germanium, and channel region 4 is the p− region of p type silicon. The forbidden energy band gap width (band gap) $E_{g1}$ of the silicon is 1.1 eV, and the forbidden energy band gap width $E_{g2}$ of the germanium is 0.66 eV. Thus, $E_{g2} < E_{g1}$, and the forbidden energy band gap width of the n+ region is smaller than that of the p− region in the pn junction. It can be appreciated from FIG. 2 that the potential barrier in the boundary regions of $x_n$ and $x_p$ of the pn junction is reduced in comparison with the pn junction formed of the conventional same semiconductor (FIG. 23).

Consider the case where reverse bias is applied to the pn junction. The pn junction having this reverse bias applied corresponds to the pn junction between the channel region and the source region of an n channel type MOS transistor. It is assumed that many holes exist in the p type region of the above-described pn junction. In other words, it is assumed that holes generated by impact ionization in the n channel type MOS transistor is accumulated in the lower portion of the channel region (p type region).

FIG. 3 is a band diagram showing the energy band of the pn junction (channel region—source region) formed of the identical semiconductor of silicon under the above conditions. FIG. 4 is a band diagram showing the energy band of the pn junction (channel region—source region) formed of different semiconductors of silicon and germanium under the above-described conditions. The pn junctions of FIGS. 3 and 4 are called homojunction and heterojunction, respectively. The diagrams of (B) of FIGS. 3 and 4 are enlarged views of the portion enclosed with the circle in the relevant (A).

It can be seen from FIG. 3 that it is necessary to diffuse holes h over the high potential barrier of $V_b$ existing between the channel region and the source region in order to diffuse holes h accumulated in the lower portion of the channel region into the source region in a conventional SOI-MOS transistor.

It can be seen from FIG. 4 that holes h accumulated in the lower portion of the channel region can flow into the source region if potential barrier $V_{b1}$ between the channel—source regions are exceeded in the SOI-MOS transistor of the present invention. Since potential barrier $V_{b1} << V_b$, the holes can easily flow into the source region.

Figure 5:
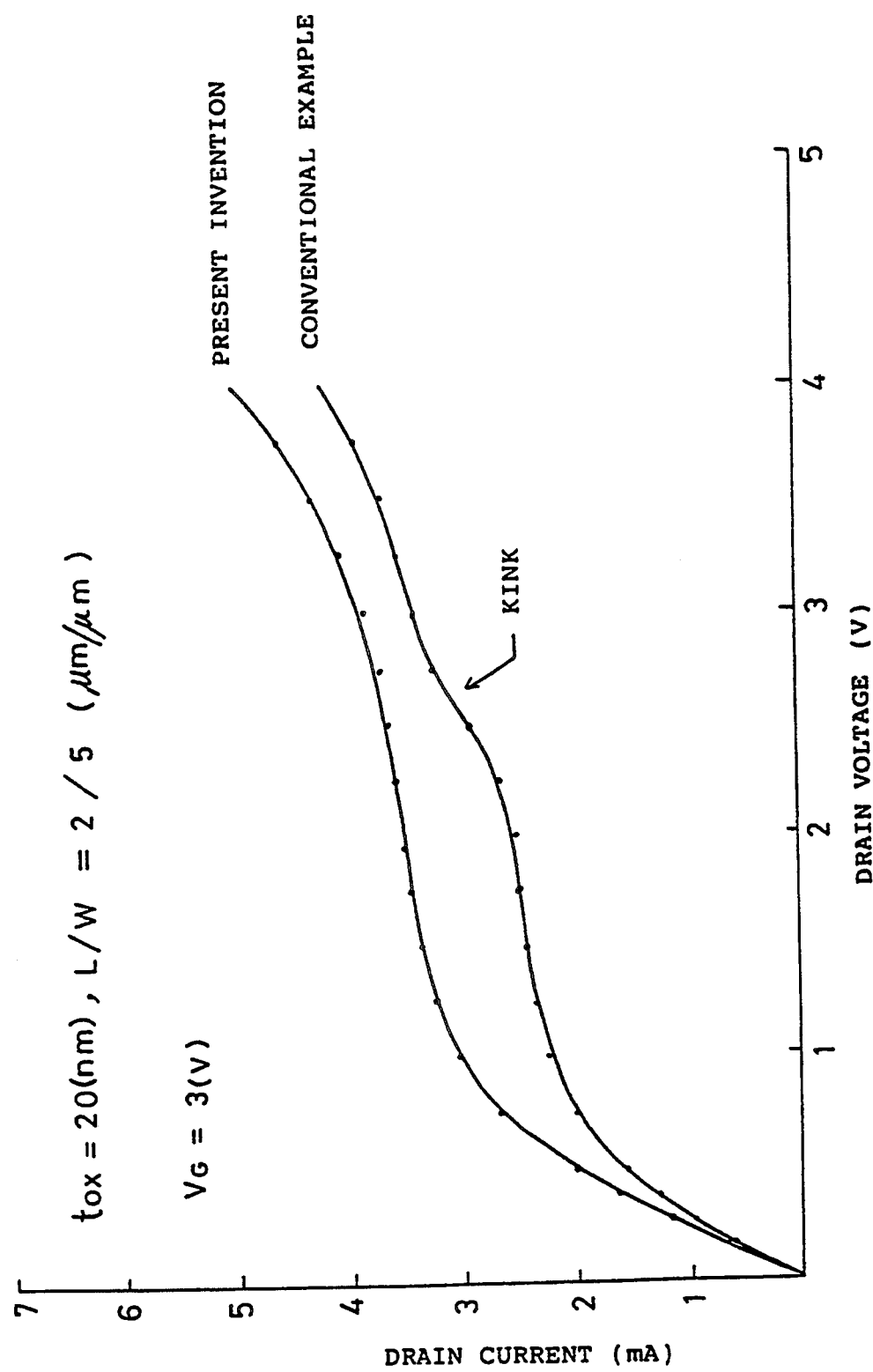
FIG. 5 is a graph showing the drain current versus drain voltage characteristic of the SOI-MOS transistor of the present invention in comparison with a conventional one.

The graph of FIG. 5 shows a simulated result of a SOI-MOS transistor. The film thickness $t_{OX}$ of the gate oxide film is 20 nm, the ratio L/W of the channel length to the channel width is 2/5 (μm/μm), and the voltage $V_G$ applied to the gate electrode is 3 V. It can be appreciated from FIG. 5 that the kink effect does not occur according to the SOI-MOS transistor of the present invention.

Figure 6:
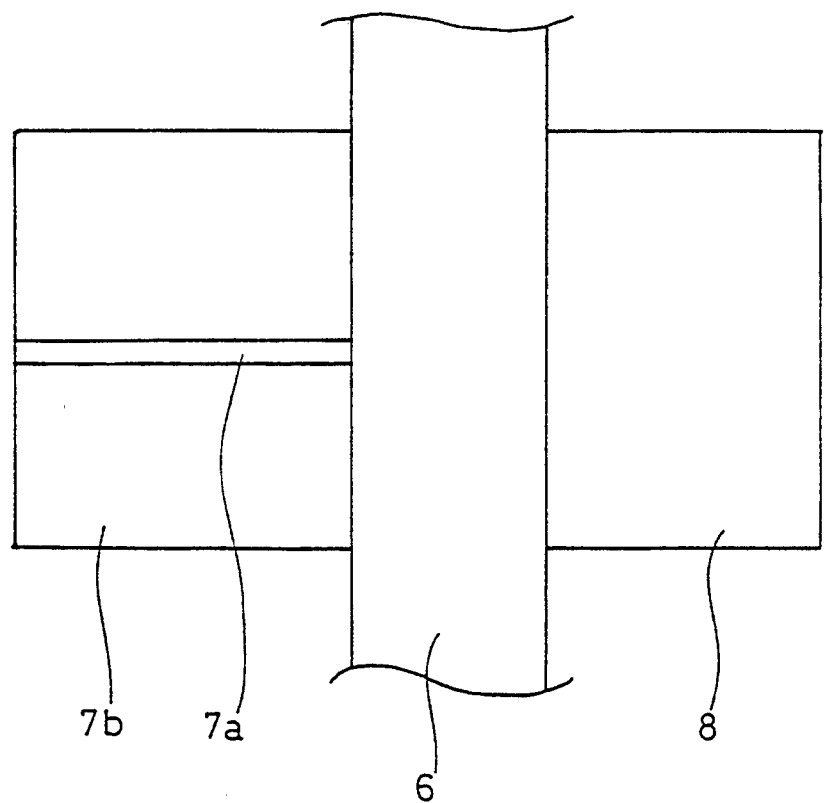
FIG. 6 is a plan view showing a SOI-MOS transistor according to another embodiment of the present invention.

Although the entire source region is formed by germanium having a forbidden energy band gap width that is smaller than that of silicon in the above embodiment, only a portion of the source region may be formed by germanium. Referring to FIG. 6, source region 7b and drain region 8 are formed of silicon. Source region 7a is formed of germanium.

Figure 7:
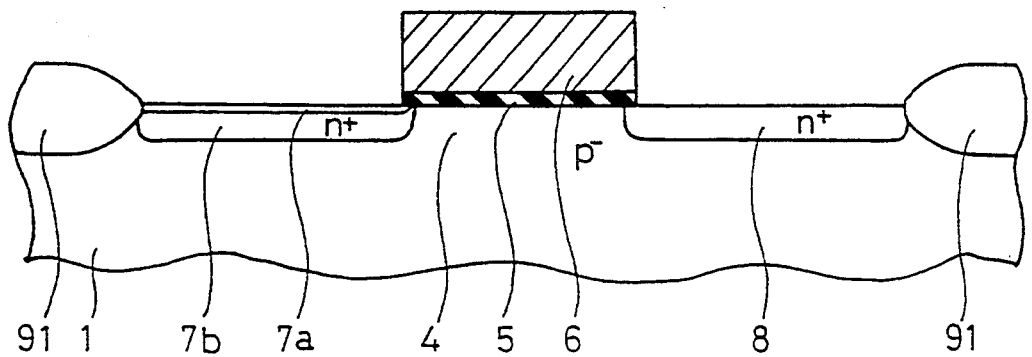

Although the above embodiments are described in which the present invention is applied to a SOI-MOS transistor, the present invention may be applied to a bulk MOS transistor. In the case the present invention is applied to a bulk MOS transistor, the potential of the semiconductor substrate does not have to be fixed. Referring to FIG. 7, an isolation insulation film 91 is formed of a thick oxide film for electrically isolating the element formation region of p type silicon semiconductor substrate 1. A p type channel region 4 of silicon is formed on p type silicon semiconductor substrate 1. An n type drain region 8 of silicon is formed on p type silicon substrate 1. The source region is formed of an n type source region 7a of germanium and an n type source region 7b of silicon. Gate electrode 6 is formed on channel region 4 with gate insulation film 5 therebetween.

Although the above embodiments are described in which the MOS transistor is formed of a semiconductor with only the source region having a small forbidden energy band gap width, both the source region and the drain region may be formed of a semiconductor having a small forbidden energy band gap width. This allows the application of the present invention to a MOS transistor where current flows in bidirections from the source region to the drain region and from the drain region to the source region.

The present invention is not limited to the above described n channel type MOS transistors, and may be applied to p channel type MOS transistors. In this case, the functions of the electrons and the holes of the descriptions are reversed.

One embodiment of a manufacturing method for a SOI-MOS transistor of the present invention will be described.

Figure 8:
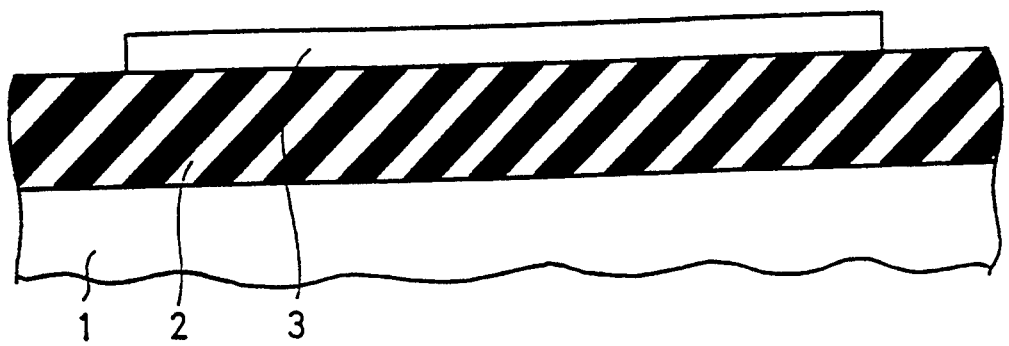
FIGS. 8 through 12 are sectional views showing in order sectional structures of a SOI-MOS transistor of the present invention in respective steps of the manufacturing method of an embodiment.

Referring to FIG. 8, insulation film 2 of silicon oxide film and the like is formed on substrate 1. An island-like semiconductor film 3 formed of silicon and the like is provided on insulation film 2.

Figure 9:
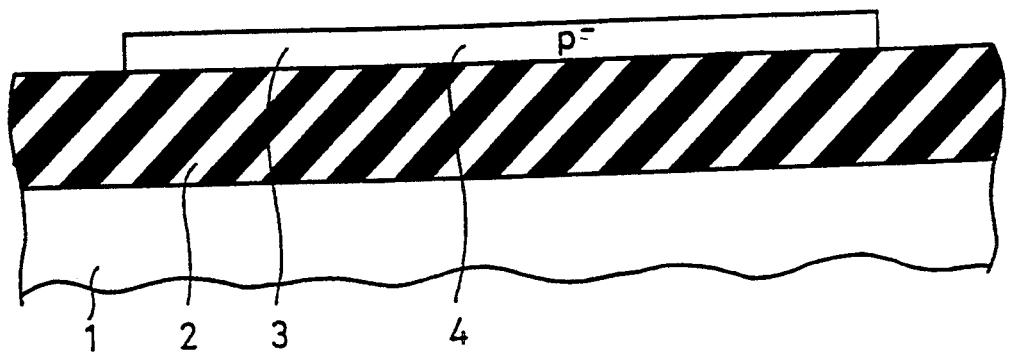

Referring to FIG. 9, p type impurities such as boron, aluminum, gallium of low concentration ($10^{12}$–$10^{13}$/cm$^2$) are introduced into semiconductor film 3. As a result, p type channel region 4 of silicon is formed.

Figure 10:
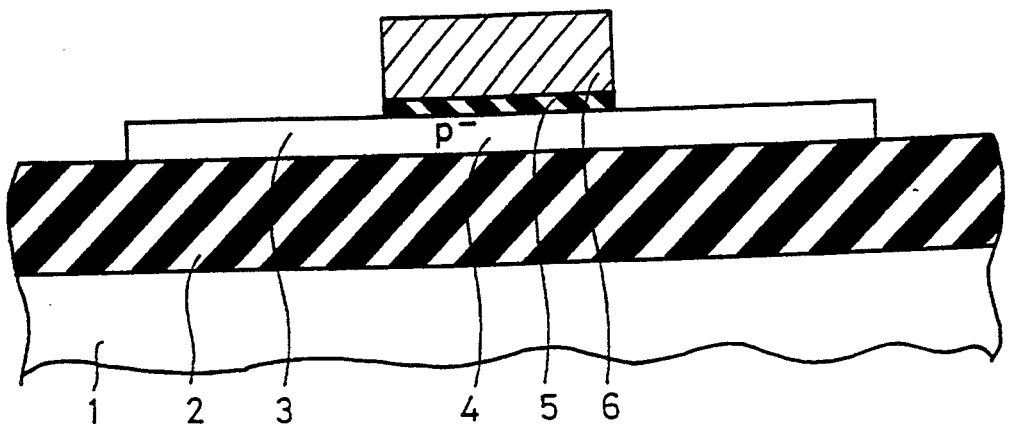

Then, gate insulation film 5 and gate electrode 6 are formed on channel region 4, as shown in FIG. 10.

Figure 11:
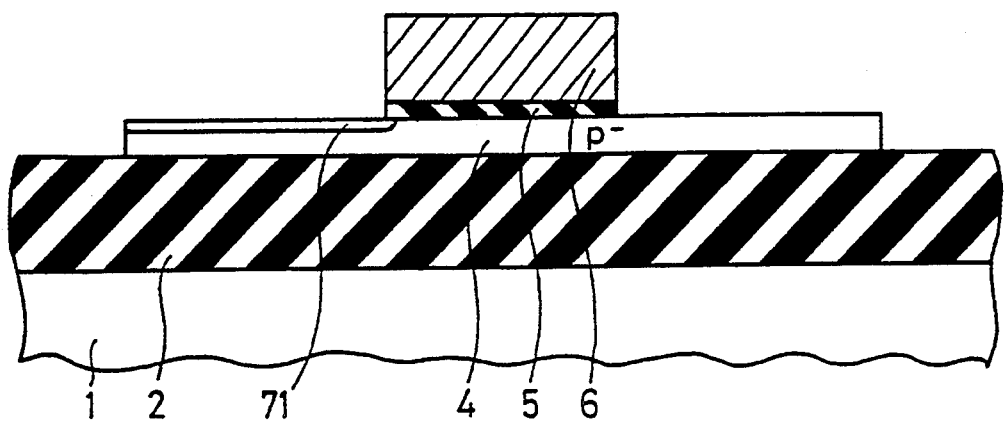

Referring to FIG. 11, germanium having a forbidden energy band gap width that is smaller than that of silicon is ion implanted to be introduced into at least a portion 71 of the region that becomes the source of the MOS transistor. By introducing germanium of a density that is greater than that of silicon, at least the portion 71 of the region that becomes the source region is substituted with germanium for silicon.

Figure 12:
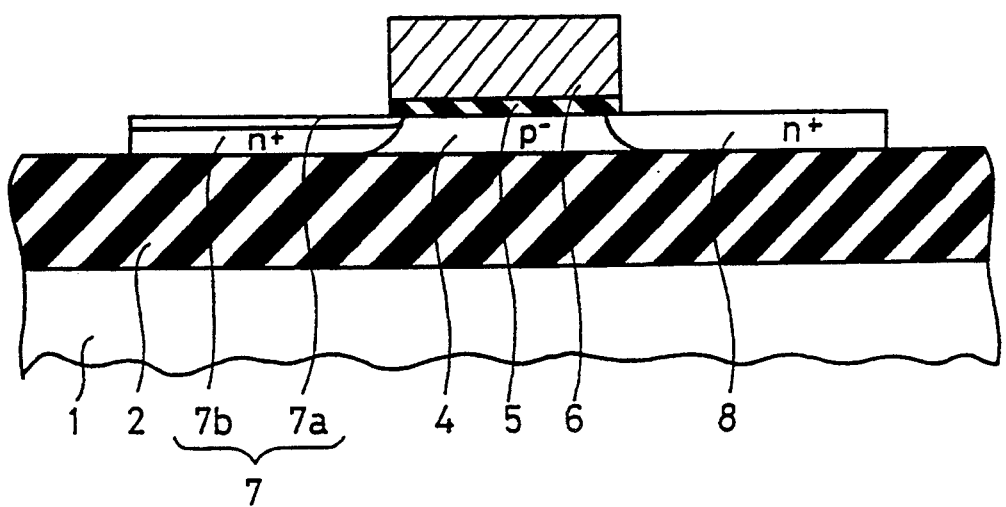

Referring to FIG. 12, n type impurities such as antimony, phosphorus, and arsenic are introduced into the regions which become the source and the drain. Thus, n type drain region 8 of silicon, n type source region 7a of germanium, and n type source region 7b of silicon are formed. Although n type source region 7 is formed by germanium region 7a and silicon region 7b in the present embodiment, the entire source region may be formed of germanium.

Another embodiment of a manufacturing method for a SOI-MOS transistor of the present invention will be described.

Figure 13:
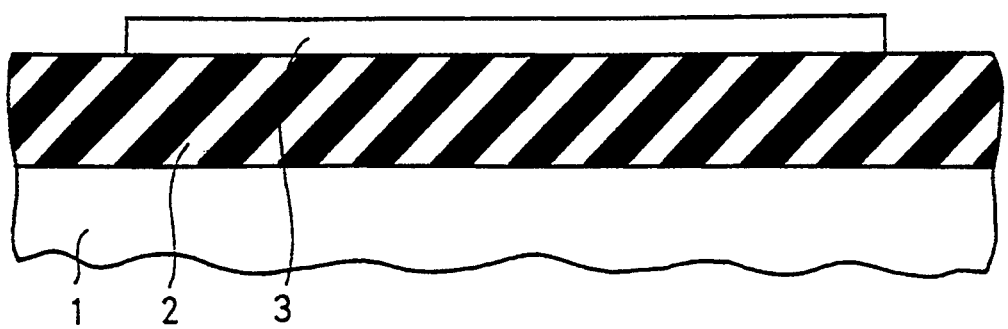
FIGS. 13 through 18 are sectional views showing in order sectional structures of a SOI-MOS transistor of the present invention in respective steps of the manufacturing method of another embodiment.

Referring to FIG. 13, insulation film 2 of silicon oxide film and the like is formed on substrate 1. Semiconductor film 3 of silicon is formed on insulation film 2.

Figure 14:
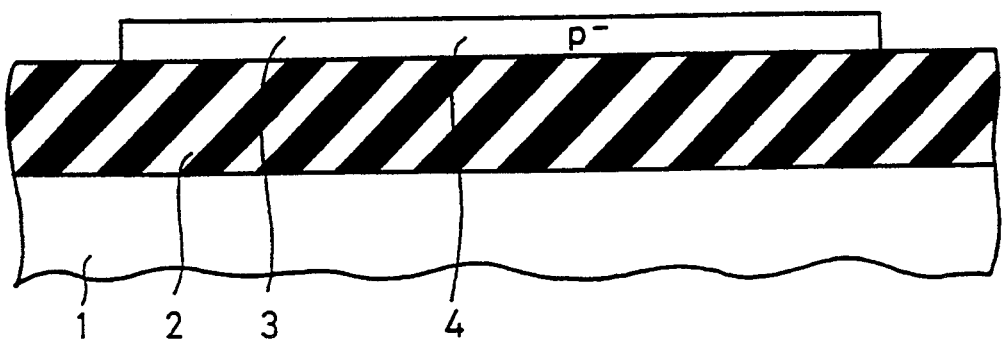

Referring to FIG. 14, p type impurities of low concentration ($10^{12}$–$10^{13}$/cm$^2$) are introduced into semiconductor film 3. Thus, a p type channel region of silicon is formed.

Figure 15:
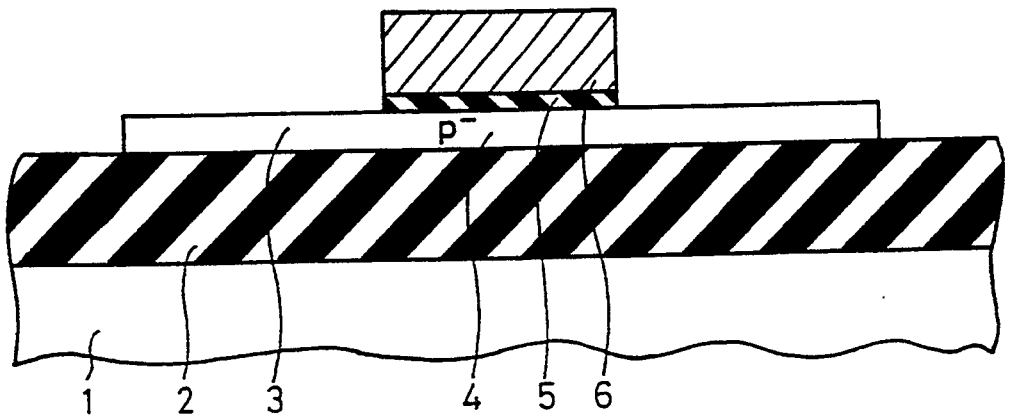

Referring to FIG. 15, gate insulation film 5 and gate electrode 6 are formed on channel region 4.

Figure 16:
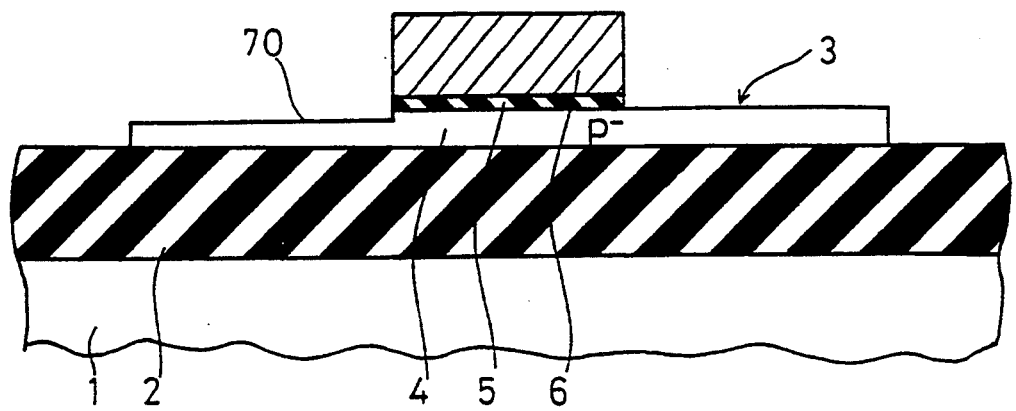

Referring to FIG. 16, silicon semiconductor film 3 is selectively removed in region 70 which becomes the source of the MOS transistor.

Figure 17:
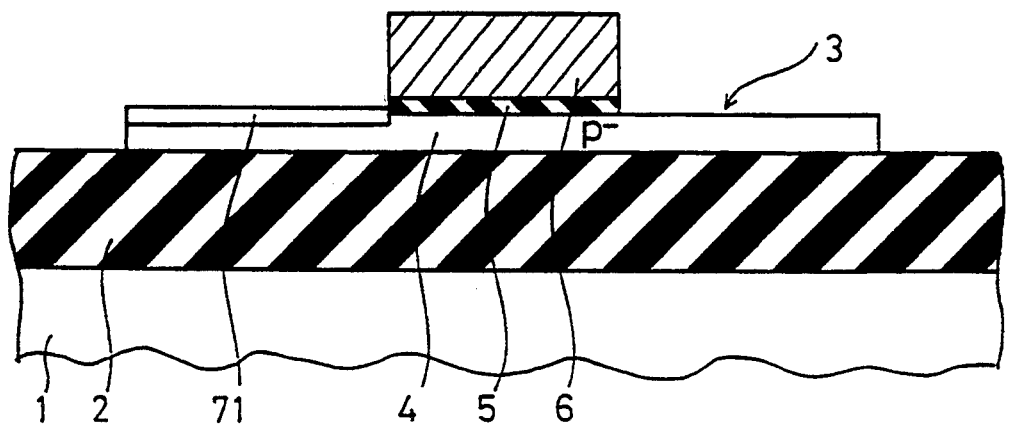

Referring to FIG. 17, germanium having a forbidden energy band gap width that is smaller than that of silicon is deposited on the region 70 which becomes the source by epitaxial growth. Thus, a germanium region 71 is formed.

Figure 18:
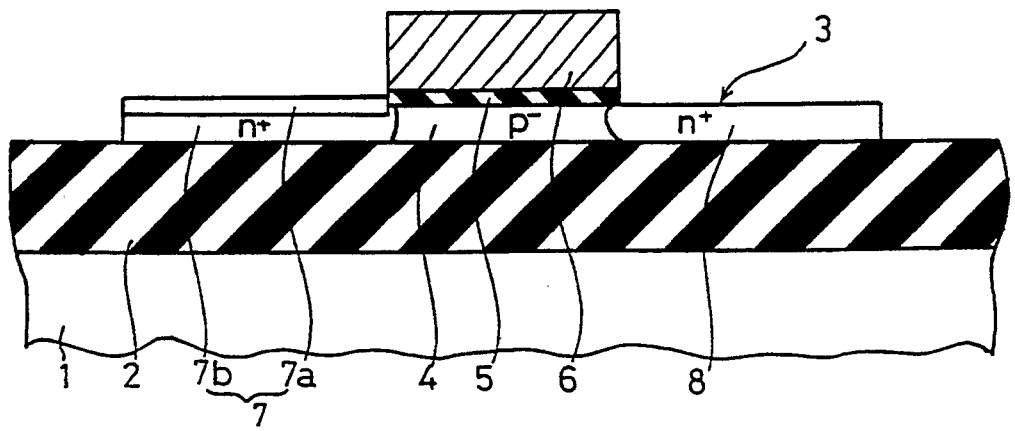
Figure 19A:
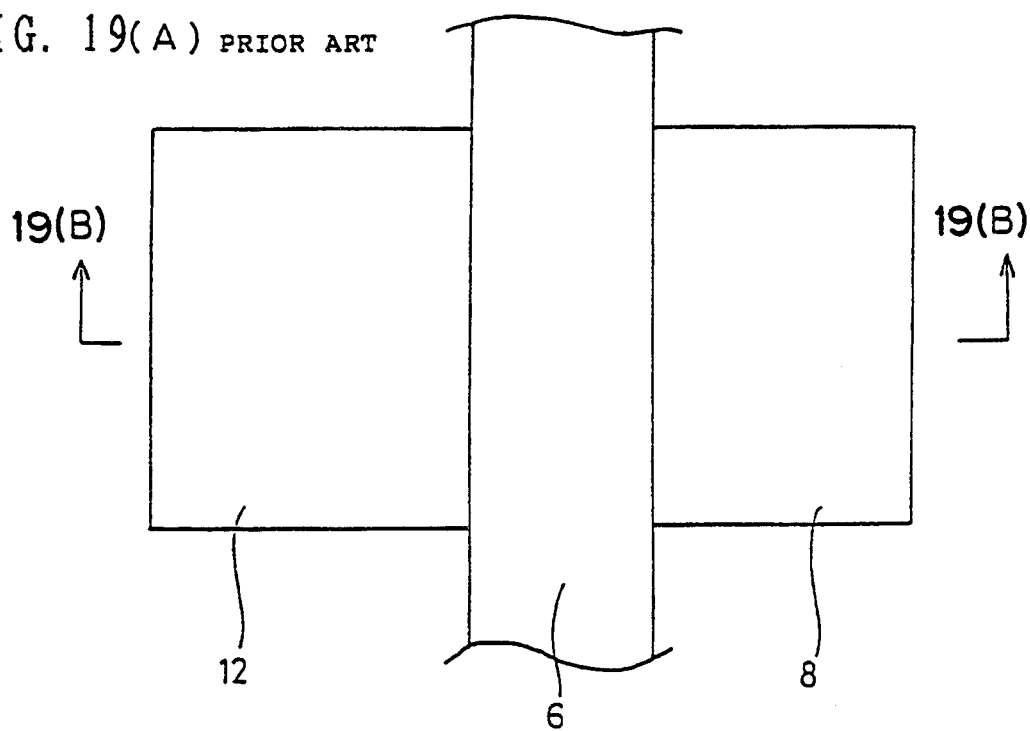
FIG. 19 is a plan view (A) and a sectional view (B) of a conventional SOI-MOS transistor.
Figure 19B:
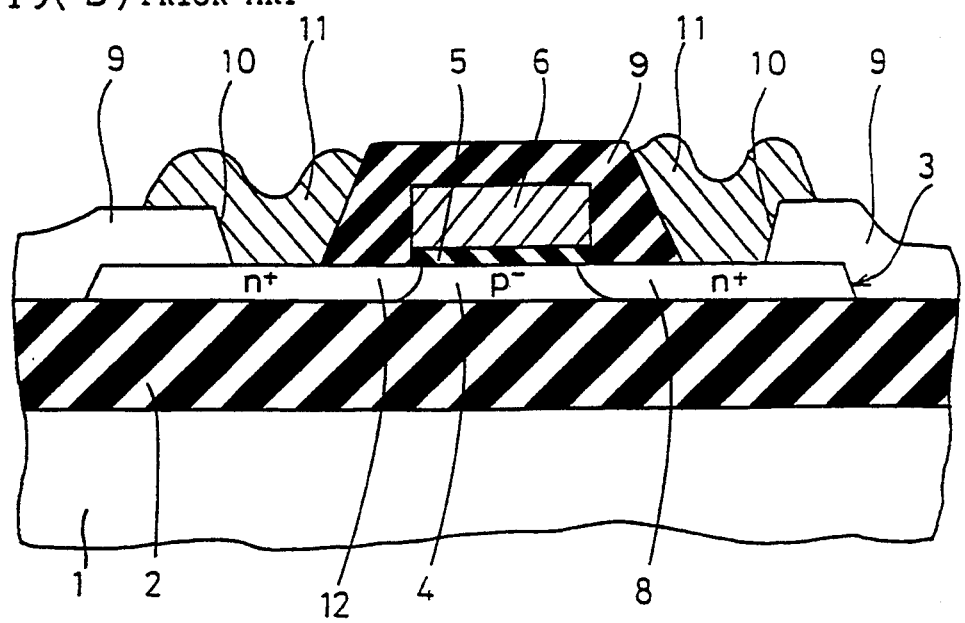
Figure 20:
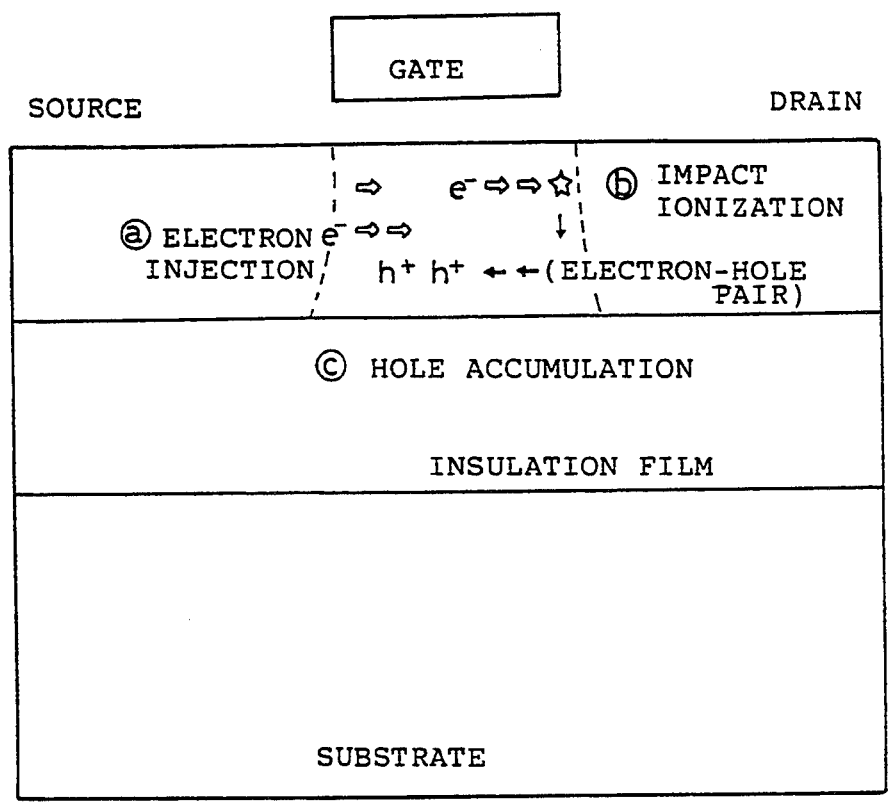
FIG. 20 is a sectional view of a conventional SOI-MOS transistor schematically showing the mechanism of destruction of a transistor due to impact ionization.
Figure 21:
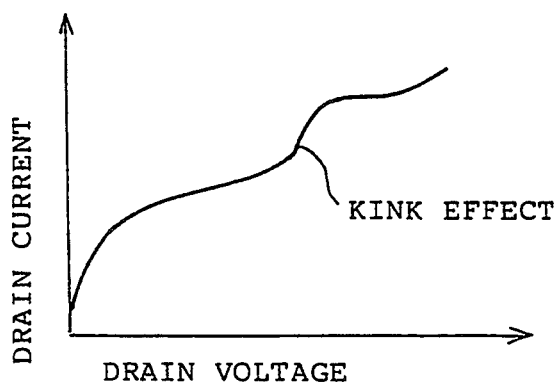
FIG. 21 is a graph showing the drain current versus drain voltage characteristic of a conventional SOI-MOS transistor.
Figure 22A:
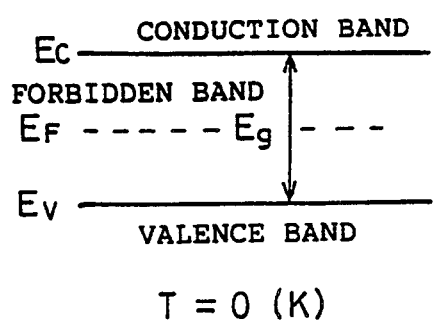
FIGS. 22(a)-(f) are a schematic diagram for explaining the energy band of a semiconductor.
Figure 22B:
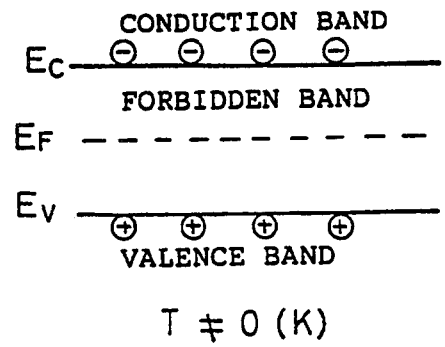
Figure 22C:
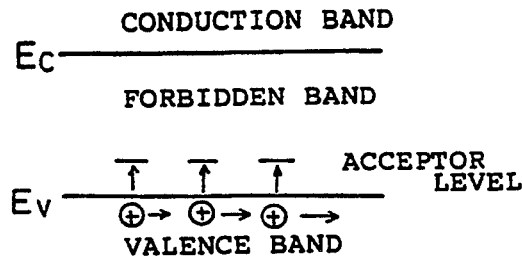
Figure 22D:
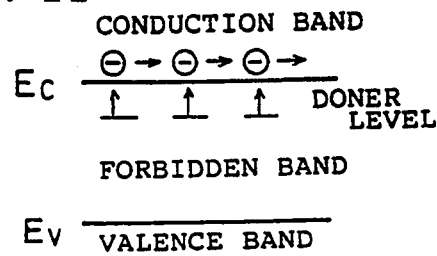
Figure 22E:
Figure 22E:
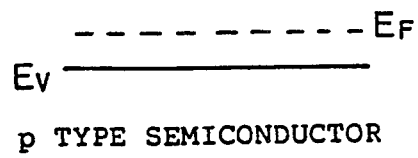
Figure 22F:
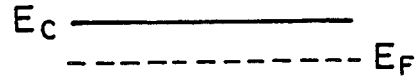
Figure 22F:

Referring to FIG. 18, n type impurities are introduced into the regions that become the source and the drain. Thus, n type source region 7 and n type drain region 8 are formed. The n type source region is formed of germanium region 7a and silicon region 7b. The n type drain region 8 is formed of a silicon region.

According to the present invention, holes (or electrons) generated by impact ionization can be removed from the channel region by virtue of a first impurity region being formed by a semiconductor having a forbidden energy band gap width that is smaller than that of the semiconductor forming the channel region. Therefore, the breakdown voltage between the source and drain in the MOS transistor can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a field effect transistor, comprising:
   a semiconductor layer having a main surface and including a first semiconductor portion of a first conductivity type and having a first forbidden energy band gap width,
   first and second impurity regions of a second conductivity type formed within said semiconductor layer with a distance therebetween to define a channel region, and
   a gate electrode formed on said channel region with an insulation film therebetween,
   wherein at least said first impurity region comprises a second semiconductor portion having a second forbidden energy band gap width that is smaller than said first forbidden energy band gap width, said first semiconductor portion comprises silicon, and said second semiconductor portion comprises germanium;
   wherein said first impurity region comprises a first semiconductor layer including said first semiconductor portion, and a second semiconductor layer including said second semiconductor portion; and
   wherein said second semiconductor layer extends within said first semiconductor layer and is sandwiched by said first semiconductor layer so as to be enclosed by said first semiconductor layer in a geometrical plane parallel to said main surface of said semiconductor layer.

2. The semiconductor device according to claim 1, wherein said first impurity region is a source region of said field effect transistor.

3. The semiconductor device according to claim 1, wherein said second semiconductor layer extends in a direction parallel to a line defining a shortest distance between said first and second impurity regions.

* * * * *